(12) United States Patent
Ogatsu

(10) Patent No.: US 9,274,373 B2
(45) Date of Patent: Mar. 1, 2016

(54) PORTABLE DEVICE HAVING DISPLAY UNIT

(71) Applicant: NEC CORPORATION, Tokyo (JP)

(72) Inventor: Toshinobu Ogatsu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 13/896,677

(22) Filed: May 17, 2013

(65) Prior Publication Data

US 2013/0250205 A1    Sep. 26, 2013

Related U.S. Application Data

(63) Continuation of application No. 12/945,172, filed on Nov. 12, 2010, now Pat. No. 8,558,962, which is a continuation of application No. 12/064,685, filed as application No. PCT/JP2006/316477 on Aug. 23, 2006, now Pat. No. 9,104,066.

(30) Foreign Application Priority Data

Aug. 25, 2005 (JP) ................................. 2005-244813

(51) Int. Cl.
*G02F 1/1333* (2006.01)
*G02F 1/1335* (2006.01)
(Continued)

(52) U.S. Cl.
CPC .... *G02F 1/133608* (2013.01); *G02F 1/133615* (2013.01); *H04M 1/0202* (2013.01);
(Continued)

(58) Field of Classification Search
CPC .............. G02F 1/133308; G02F 1/133608; G02F 1/133615; H04M 1/0266; H04M 1/185; H04M 1/0202; H05K 5/0086; H05K 5/04; H05K 5/0017

USPC ......................................... 349/58; 361/679.3
See application file for complete search history.

(56) References Cited

U.S. PATENT DOCUMENTS 4,852,736 A    8/1989 Kojima et al.
5,570,267 A    10/1996 Ma
(Continued)

FOREIGN PATENT DOCUMENTS

EP    0 641 643 A2    3/1995
EP    1 376 208 A1    1/2004
(Continued)

OTHER PUBLICATIONS

Extended European Search Report issued for corresponding EP Application No. 13162919.8, dated Jun. 26, 2013.
(Continued)

*Primary Examiner* — Michael Caley
(74) *Attorney, Agent, or Firm* — Arent Fox LLP

(57) ABSTRACT

A metal structure that holds a display unit, as the main structure, and a casing structure that is integrally molded from resin onto the metal structure. The metal structure is resilient against flexural loads, torsional loads, and other deformations from the exterior upon the display unit composed of thin plate glass, because the member that protects the display unit is in a box shape. The display unit itself can be protected from damage even if rigidity is reduced because of a thinner profile. The metal structure is manufactured by thin plate pressing and sufficient strength can be maintained even if the thickness is low. Furthermore, the metal structure is configured as a frame part of the entire casing, the rigidity of the entire device can therefore be maintained by using this structure, and the mounting board and functional components other than the display unit can also be protected.

48 Claims, 12 Drawing Sheets

(51) Int. Cl.
*H04M 1/02* (2006.01)
*H04M 1/18* (2006.01)
*H05K 5/00* (2006.01)
*H05K 5/04* (2006.01)

(52) U.S. Cl.
CPC ............ *H04M1/0266* (2013.01); *H04M 1/185* (2013.01); *H05K 5/0017* (2013.01); *H05K 5/0086* (2013.01); *H05K 5/04* (2013.01)

(56) References Cited

U.S. PATENT DOCUMENTS

| | | | |
|---|---|---|---|
| 6,388,722 | B1 | 5/2002 | Yoshii et al. |
| 6,392,724 | B2 | 5/2002 | An et al. |
| 8,558,962 | B2 * | 10/2013 | Ogatsu .................... 349/58 |
| 2002/0003591 | A1 | 1/2002 | Giannatto |
| 2002/0081115 | A1 | 6/2002 | Suzuki et al. |
| 2002/0113918 | A1 * | 8/2002 | Hiratsuka et al. ............... 349/65 |
| 2002/0158999 | A1 | 10/2002 | Shima |
| 2003/0019604 | A1 | 1/2003 | Ishiduka et al. |
| 2003/0128307 | A1 | 7/2003 | Ito et al. |
| 2003/0160909 | A1 | 8/2003 | Wang |
| 2004/0114318 | A1 | 6/2004 | Nuovo et al. |
| 2004/0189889 | A1 | 9/2004 | Nitto et al. |
| 2005/0037215 | A1 | 2/2005 | Ishiduka et al. |
| 2005/0063170 | A1 | 3/2005 | Lee et al. |
| 2005/0073622 | A1 * | 4/2005 | Kitaka et al. .................... 349/58 |
| 2005/0196123 | A1 | 9/2005 | Kumagai |
| 2005/0280750 | A1 | 12/2005 | Cho et al. |
| 2005/0285991 | A1 | 12/2005 | Yamazaki |
| 2006/0061859 | A1 | 3/2006 | Chen et al. |
| 2006/0146223 | A1 | 7/2006 | Iwai et al. |
| 2009/0004408 | A1 | 1/2009 | Nakanishi et al. |

FOREIGN PATENT DOCUMENTS

| | | |
|---|---|---|
| JP | 2000-114742 A | 4/2000 |
| JP | 2000-223855 A | 8/2000 |
| JP | 2001-168554 A | 6/2001 |
| JP | 2002-051132 A | 2/2002 |
| JP | 2002-225073 A | 8/2002 |
| JP | 2003-258446 A | 9/2003 |
| JP | 2004-228238 A | 8/2004 |
| JP | 2004-317588 A | 11/2004 |

OTHER PUBLICATIONS

Extended European Search Report issued for corresponding EP Application No. 13162928.9, dated Jun. 26, 2013.
European Office Action issued for corresponding Application No. 13162928.9 on Nov. 11, 2015.

* cited by examiner

PORTABLE DEVICE HAVING DISPLAY UNIT

CROSS REFERENCE TO RELATED APPLICATIONS

The present application is a continuation of application Ser. No. 12/945,172, filed Nov. 12, 2010, which is a continuation of application Ser. No. 12/064,685, filed Feb. 25, 2008, which is a §371 of PCT/JP2006/316477, filed Aug. 23, 2006, which claims priority to Japanese application No. 2005-244813, filed Aug. 25, 2005.

TECHNICAL FIELD

The present invention relates to a portable phone or another portable device having a display unit, and particularly relates to an improvement of a casing structure for protecting the display unit and increasing strength in conjunction with smaller, thinner devices.

BACKGROUND ART

There is a strong demand for portable phones having a camera function, a larger screen, and other advanced functions, due to expanded needs for the functions. On the other hand, there is also a strong demand for a smaller, thinner profile from the viewpoint of portability. Various structures have been adopted to respond to these contradictory demands. The casing structure that is used on portable phone terminals generally has a housing in which a plurality of resin or metal components are loosely fitted and affixed using pawls or the like, affixed by screws, sandwiched, or held via another method. Alternatively, these methods may be used in combination. There are also cases in which a cushion or the like is affixed so that deformations in the outer casing are not transmitted to the interior. On the other hand, portable phones are exposed to various load conditions such as being subjected to bending loads, as in instances of being unintentionally dropped when carried, being pocketed and sat upon when the user sits in a chair and the like, or being pressed by books and the like when in a briefcase. Display units typified by liquid crystals are ordinarily made of glass, and it is important to ensure the strength of a casing structure because it cannot be that the display unit can withstand these types of loads. For this reason, in order to ensure the strength of the resin casing, the thickness of the walls may be increased, or, when the liquid crystal display unit is enlarged, a specialty frame part may be added or the frame part may be additionally composed of metal, as is described in Patent Document 1. Additionally, a structure may be adopted using a metal frame composed of magnesium alloy and the like, as is described in Patent Documents 2 and 3.

Patent Document 1: Japanese Laid-Open Patent Application No. 2004-317588.

Patent Document 2: Japanese Laid-Open Patent Application No. 2002-51132.

Patent Document 3: Japanese Laid-Open Patent Application No. 2000-114742.

DISCLOSURE OF THE INVENTION

Problems the Invention is Intended to Solve

However, there are a number of problems in the casing structures disclosed in these patent documents.

The first problem is that even if a fiber reinforced resin or another resin material having a high modulus of elasticity is used in the liquid crystal holding member, the modulus of elasticity of the resin is low in comparison with ferrous metals, having only $\frac{1}{50}$.sup.th to $\frac{1}{70}$.sup.th the elasticity of the metals, and the thickness must be increased in order to ensure the strength. As a result, the need for a smaller, thinner profile cannot be met.

The second problem is that of fluidity during molding when resin molding is used. A prescribed thickness or greater must be assured, and there is a limit to making the device thinner.

The third problem is that a certain thickness becomes necessary for molding even with the use of excellent molding methods such as thixotropic molding conducted using magnesium alloys and the like. For this reason, an insufficient contribution is made to achieving a thinner profile, even if the method is excellent for ensuring strength.

The fourth problem is that although sufficient strength can be assured when a metal frame is used and the frame of the liquid crystal portion is composed of a different component, such an approach is unsuitable for achieving a smaller, thinner profile because the frame member itself must have a certain thickness. Furthermore, screw clamps, pawl fasteners, and other connecting regions between the metal frame and a resin casing become essential, and, as a result, there is a limitation to making the profile smaller and thinner.

The fifth problem is that an adhesive surface area must be assured, and this is an impediment to achieving a smaller, thinner profile even if the resin and metal are bonded together using an adhesive agent in order to solve the fourth problem.

The sixth problem is that in the mode shown in Patent Document 3, the resin and the magnesium casing components come apart easily when the bonding surface area is small, as shown in FIGS. 3, 6 and 7. For this reason, a bonding surface area between the resin and the magnesium casing portion must be designed to be as large as possible. For this reason, the thickness of the metal components cannot be reduced, the shape becomes complicated, and other drawbacks occur.

The present invention was contrived in view of the foregoing problems, and an object thereof is to provide a portable device having a display unit provided with a casing that can protect the display unit and that has a structure that is suitable for a smaller and thinner profile.

Means for Solving the Problems

A portable device having a display unit according to a first aspect of the present invention is characterized in having a metal structure composed of a molded article in the form of a bottomed concave-shaped metal plate, which has contiguous side walls for holding the display unit; and a framed-shaped resin casing injection molded onto the surface of the metal structure and integrally formed with the metal structure; a casing being composed of the metal structure and the resin casing.

It is preferred that the metal structure in the portable device have a rib structure along the bottomed concave-shaped part. The rigidity of the casing is thereby increased.

It is preferred that the metal structure be formed by drawing a thin metal plate, and the side wall surfaces of the bottomed concavity shape be contiguous.

It is also preferred that the metal structure be formed by, e.g., sintering or precision casting, including injection molding.

It is also preferred that the resin casing be exposed on an exterior surface. The casing can achieve high design characteristics by resin molding in relation to the exterior, while maintaining a thin profile and high rigidity.

It is further preferred that the resin casing at a hinge area and vicinity thereof be molded using highly elastic resin material. In this way, both protection of internal components and less plastic deformation of the casing can be ensured.

For example, the display unit is a backlit liquid crystal, the flat bottom surface of the bottomed concave-shaped part that holds the display unit of the metal structure is composed of a mirror finish section, and the mirror finish section doubles as a reflecting plate of the liquid crystal backlight.

It is further preferred that the rib structure portion of the metal structure have a drawn part that is drawn into a cross-sectional concave shape. Deformations of the display unit in the vicinity of the hinge can thereby be reduced.

In this way, the present invention is composed of a metal structure that holds the display unit, as the main structure, and a casing structure that is integrally molded from resin onto the metal structure. The metal structure is resilient against flexural loads, torsional loads, and other deformations from the exterior upon the display unit composed of thin plate glass, because the member that protects the display unit is in a box shape. The display unit itself can be protected from damage even if rigidity is reduced because of a thinner profile. The metal structure is manufactured by thin plate pressing, and sufficient strength can be maintained even if the thickness is low. Furthermore, the rigidity of the entire device can be maintained by using this structure because the structure is the frame portion for the entire casing, and the mounting board and functional components other than the display unit can be protected. Furthermore, a variety of designs can be implemented in the same manner as an apparatus having a conventional configuration because the metal structure is internally constituted and the exterior portion is composed of resin. Plastic deformation of the metal can be reduced by combining a metal portion having a narrow range of elastic deformation and a resin component having a wide range of elastic deformation.

A portable device having a display unit according to another aspect of the present invention is characterized in having a metal structure composed of a molded article in the form of a bottomed concave-shaped metal plate that has contiguous side walls for holding the display unit, and a framed-shaped metal casing injection molded onto the surface of the metal structure and integrally formed with the metal structure, a casing being composed of the metal structure and the metal casing.

In the portable device having a display unit, the metal casing can be molded by metal injection molding, which includes thixotropic molding or die casting; and can be composed so that the coefficient of thermal expansion of the metal material to be molded is greater than the coefficient of thermal expansion of the metal structure.

Effect of the Invention

In accordance with the present invention, the display unit can be protected, the rigidity characteristics of the casing can be improved, and a smaller thinner profile can be achieved. Furthermore, design characteristics can be assured by molding the exterior from a resin while maintaining a thin profile and high rigidity. Also, plastic deformations that readily occur when a metal casing is used can be kept to a minimum.

KEY

Figure 1:
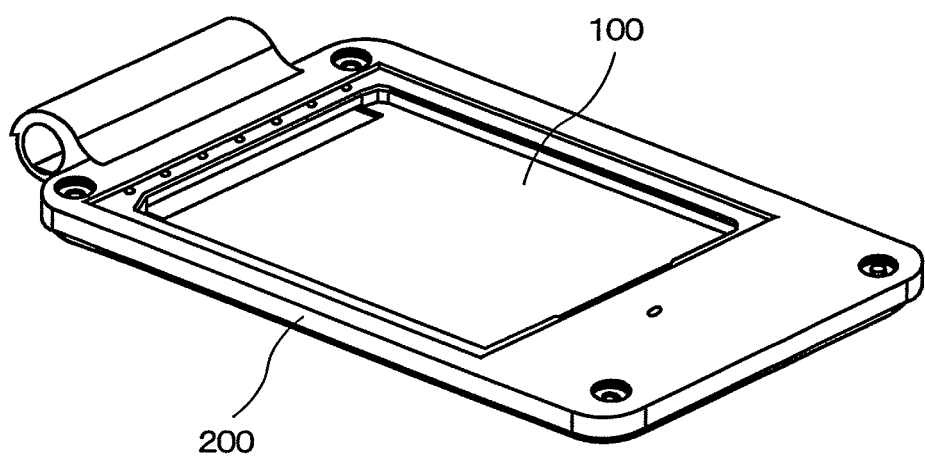
FIG. 1 is a perspective view showing the casing structure of the portable device according to an embodiment of the present invention.

100: metal structure
101: display unit holding section
102: cable aperture
103: rib
104: aperture
105: coupling hole
106: notch
107: holding pawl
108: aperture
109: drawn member
110: cutaway section
111: cut section
200: resin casing
201: rib
202: speaker sound hole
203: hinge area
204: screw hole
300: rear cover
301: rib
302: display opening
400: main display unit
500: mount board
501: rear surface protective screen opening
600: protective screen
700: rear surface display unit
800: rear surface protective screen
900: fastening screw

BEST MODE FOR CARRYING OUT THE INVENTION

Figure 2:
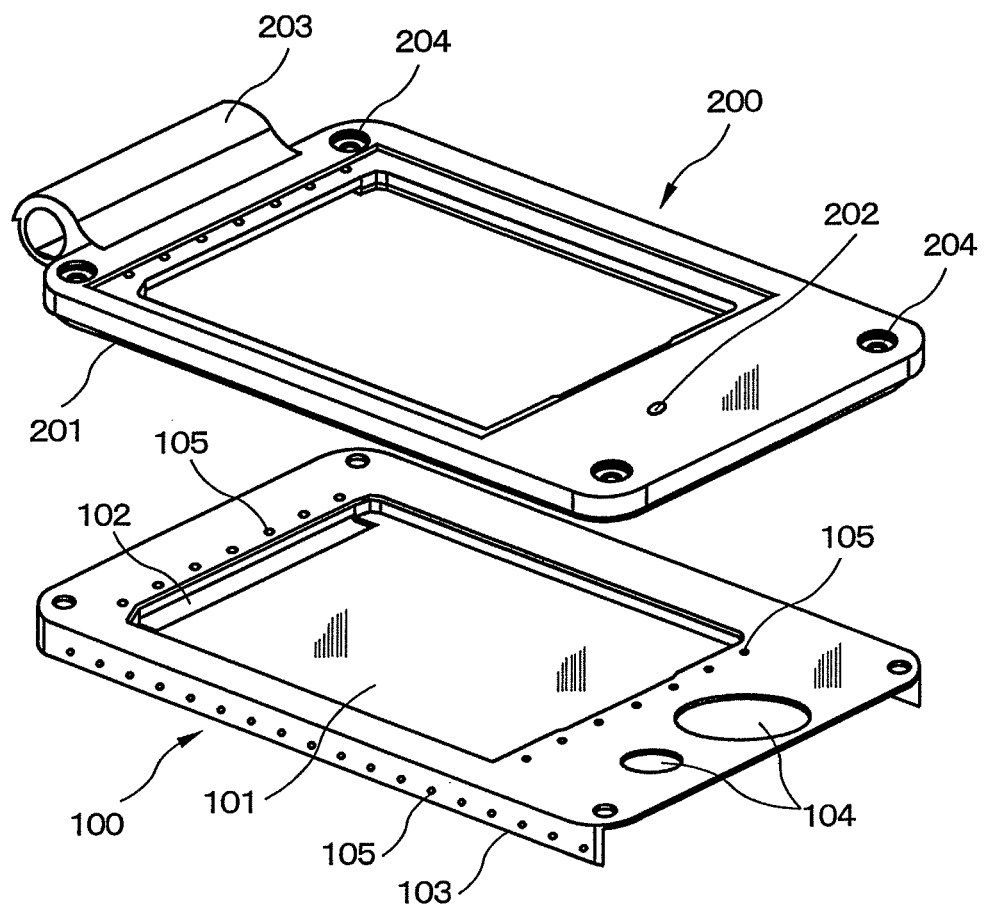
FIG. 2 is an exploded perspective view in which the metal structure 100 shown in FIG. 1 is detached.

Next, embodiments of the present invention will be described in detail with reference to the diagrams. FIG. 1 is a perspective view showing the casing structure of the portable device having a display unit according to the embodiments of the present invention. FIG. 2 is an exploded perspective view in which the metal structure 100 shown in FIG. 1 is detached.

Figure 3:
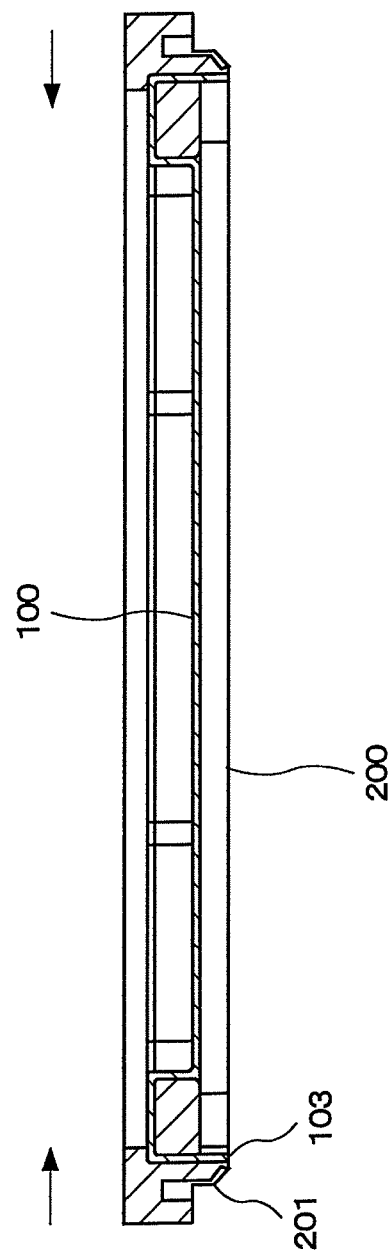
FIG. 3 is a cross-sectional view of the metal structure 100.
Figure 4:
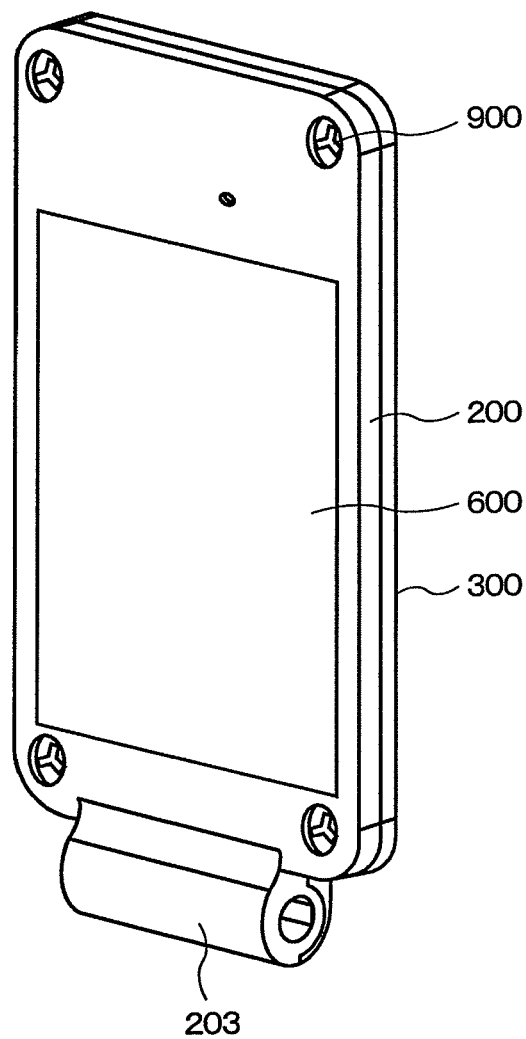
FIG. 4 is a perspective view of a folding version of the portable device after the display unit has been assembled.
Figure 5:
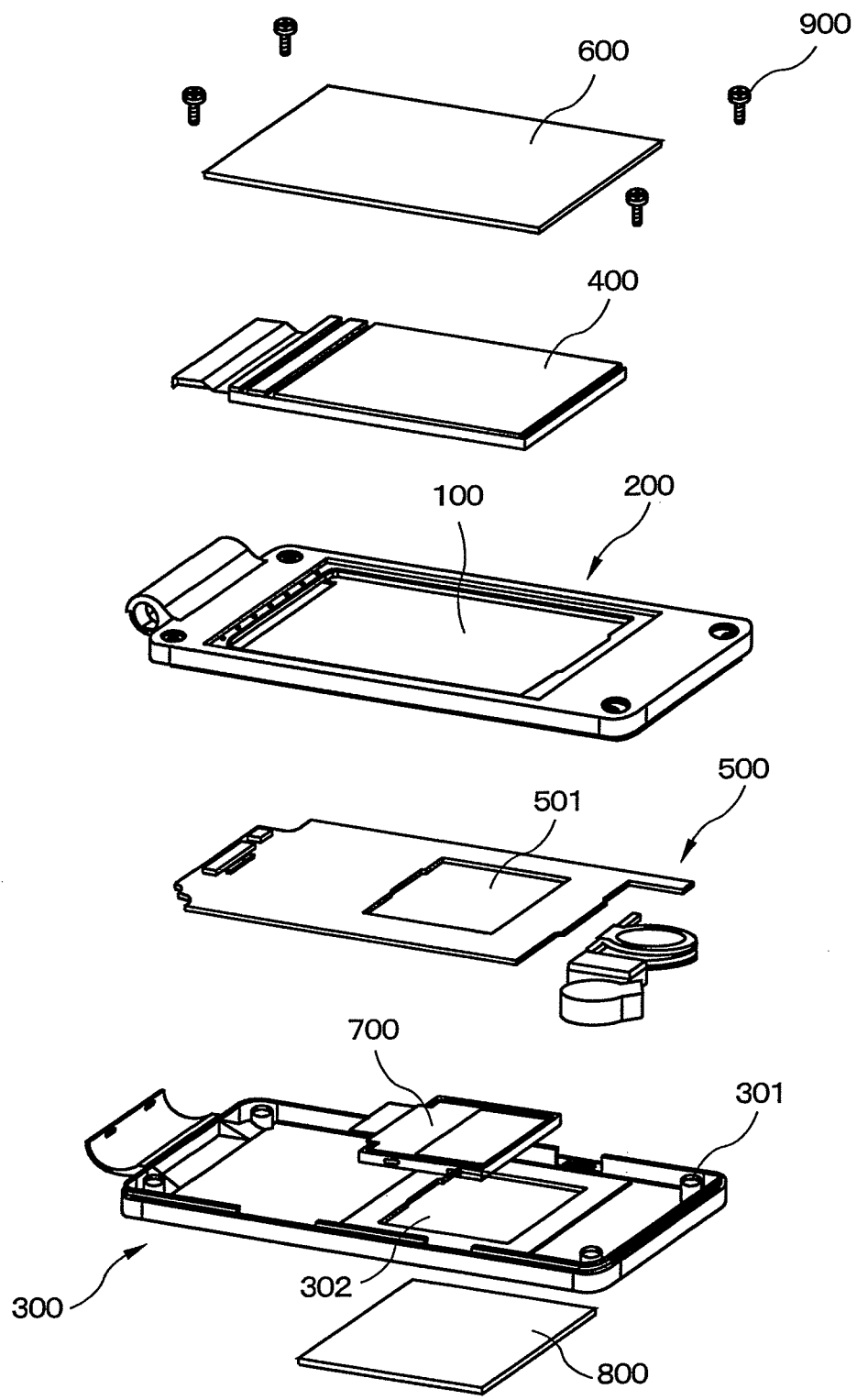
FIG. 5 is an exploded perspective view of FIG. 4.
Figure 6:
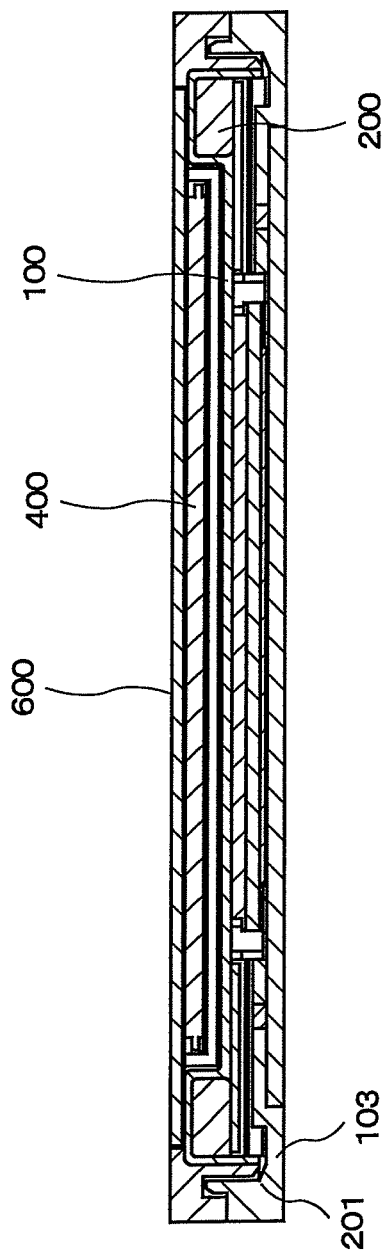
FIG. 6 is a cross-sectional view of FIG. 4.

FIG. 3 is a cross-sectional view of the metal structure 100. FIG. 4 is a perspective view of a folding version of the portable device after the display unit has been assembled. FIG. 5 is an exploded perspective view of FIG. 4. FIG. 6 is a cross-sectional view of FIG. 4.

The metal structure 100 has a display unit holding section 101 for holding a liquid crystal or other display unit, a cable aperture 102 through which a flexible cable of the display unit is passed, a rib 103 for maintaining flexural rigidity in the lengthwise direction of the liquid crystal, and holes 104 for a speaker and a receiver, as shown in FIGS. 1 and 2. The metal structure 100 is formed by press working using a thin plate composed of stainless steel having a thickness of approximately 0.2 mm to 0.4 mm. The metal structure 100 is preferably formed using a steel material having considerable elastic deformation, which is referred to as spring material, in order to reduce in-service plastic deformation. The display unit holding section 101 is formed by drawing and has considerable flexural and torsional rigidity.

A frame-shaped resin casing 200 is integrally formed with the metal structure 100. In other words, the resin casing 200 is formed integrally with the metal structure 100 by injection molding so as to surround the entire metal structure 100. At this time, the metal structure 100 is provided with very small coupling holes 105, and resin enters into the coupling holes 105 in order to connect the metal plate of the metal structure 100 and the resin covering member of the resin casing 200. After this integral formation, the resin casing 200 and the metal structure 100 are cooled, and are therefore caused to undergo thermal contraction, but the metal structure 100 shrinkage is far less than that of the resin shrinkage. For this reason, deformation often occurs.

However, the metal structure 100 in the present invention is designed in a box shape and the stand-alone hardness of the metal structure is much higher than that of the resin casing 200. Furthermore, deformations from shrinkage can be cancelled out by making the resin casing 200 that covers the outer surface of the metal structure uniform in thickness. In the lengthwise direction, in which a load tends to be applied, plastic deformation of the metal can be kept to a minimum due to the elasticity of the resin via the resin ribs on both sides along the metal structure 100. The hinge peripheral area is composed of the resin casing and can absorb shock energy without undergoing plastic deformations due to shock loads.

The resin casing 200 is provided with a speaker sound hole 202, and a rib 201 for fitting and fastening a rear cover 300. Moreover, formed on the resin casing are a hinge member 203 for making a connection to the lower casing, and screw holes 204 for fastening the rear cover. Ribs 301 (see FIG. 5) for fitting the resin casing 200 are provided to the rear cover 300, and a rear surface display opening 302 is punched therein. The rear cover 300 may be made of resin molding material or may be made of metal in order to obtain a thinner profile. Alternatively, the two may be integrally formed.

The method of assembling the portable device having a display unit according to the embodiments of the present invention will be described next with reference to FIG. 5. First, a main display unit 400 is mounted in the resin casing 200 that is integrally formed with the metal structure 100. The wiring of the display unit 400 is connected to a mount board 500 via the cable aperture 102. A protective screen 600 is applied to the resin casing 200 and the front surface of the main display unit 400. Also, a rear surface display unit aperture 501 is provided to the mount board 500, and a rear surface display unit 700 is disposed in the position of the rear surface display unit aperture 501. A rear surface protective screen 800 of the rear surface display unit 700 is bonded to the rear cover 300. The rear cover 300 and the resin casing 200 are brought together, the rear cover 300 is fitted to the resin casing 200, and the two are fastened using fastening screws 900.

A reflecting plate component must be added in order to efficiently reflect the light of a backlight light guide plate when the main display unit 400 is a backlit liquid crystal, but in the present invention, the reflective portion is a thin stainless steel plate, and a reflecting plate is rendered unnecessary by using a stainless steel material that has been polished in advance to a mirror finish.

The metal structure 100 of the present invention readily undergoes plastic deformation because the elastic range is narrow for ordinary press material. On the other hand, material having high spring characteristics is not suitable for precision pressing, which includes drawing, because the molding characteristics of the material are compromised by the high spring characteristics. In the present invention, the shape of the metal structure is simplified, whereby a material endowed with greater spring characteristics than ordinary material can be used. By using this solution, the elasticity range of the metal structure 100 is increased, the necessity of using a resin material having the required high modulus of elasticity is eliminated, and options in choosing resin materials are increased.

In such a portable device, the minimum thickness is determined by the sum of the thickness of the devices of the display portion, the thickness of the protective screen, the gap between the protective screen and the display unit, the thickness of the display unit, the thickness of the casing, the thickness of the rear surface display unit, the thickness of the rear surface protective screen, and the gap between the rear surface protective screen and the rear surface display unit. However, if the thickness of each component is reduced, the strength will be reduced in proportion to the cube of the thickness, unless materials are changed. The thickness and strength of the casing portion in the present invention are selected so that the thickness is 0.5 times and the strength ratio is 6 to 8 times of those achieved when the surface of the holding portion of the display unit is made of resin, and the thickness is 0.6 times and the strength ratio is approximately 1.2 times in comparison with a magnesium alloy. Furthermore, since the folding portion has strength, the same level or greater level of strength can be assured in comparison with a conventional resin structure, even if the thickness of the device is halved.

Figure 7:
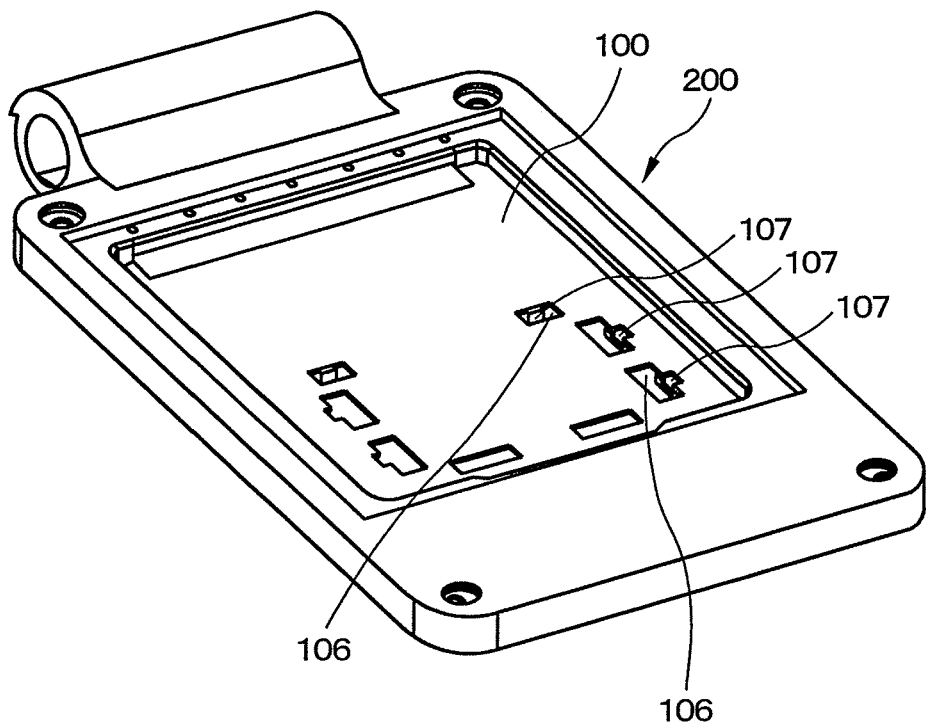
FIG. 7 is a perspective view showing the casing structure of the portable device according to a second embodiment of the present invention.
Figure 8:
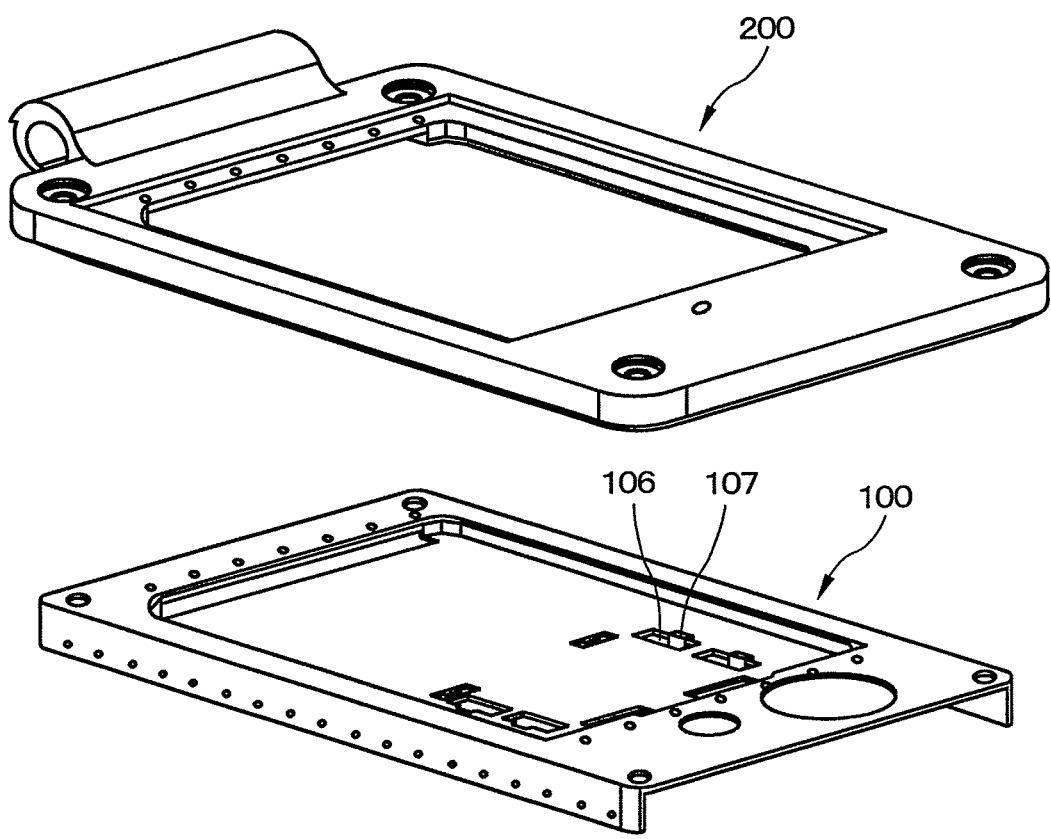
FIG. 8 is an exploded perspective view of FIG. 7.
Figure 9:
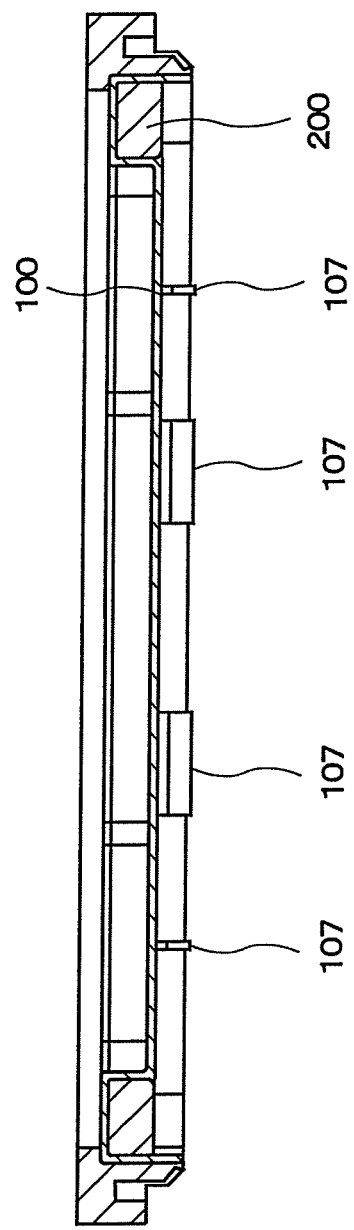
FIG. 9 is a cross-sectional view of FIG. 7.

FIG. 7 is a perspective view showing a second embodiment of the portable device of the present invention. FIG. 8 is an exploded perspective view of FIG. 7. FIG. 9 is a cross-sectional view. Rectangular-shaped notches 106 are provided by thin plate pressing along the four sides of the outside periphery of the rear surface display unit, and holding pawls 107 that hold the rear surface display unit 700 are formed inside the notches 106. The rear surface display unit 700 can be held by these holding pawls, and dislocation when a shock is applied can be reduced.

Figure 10:
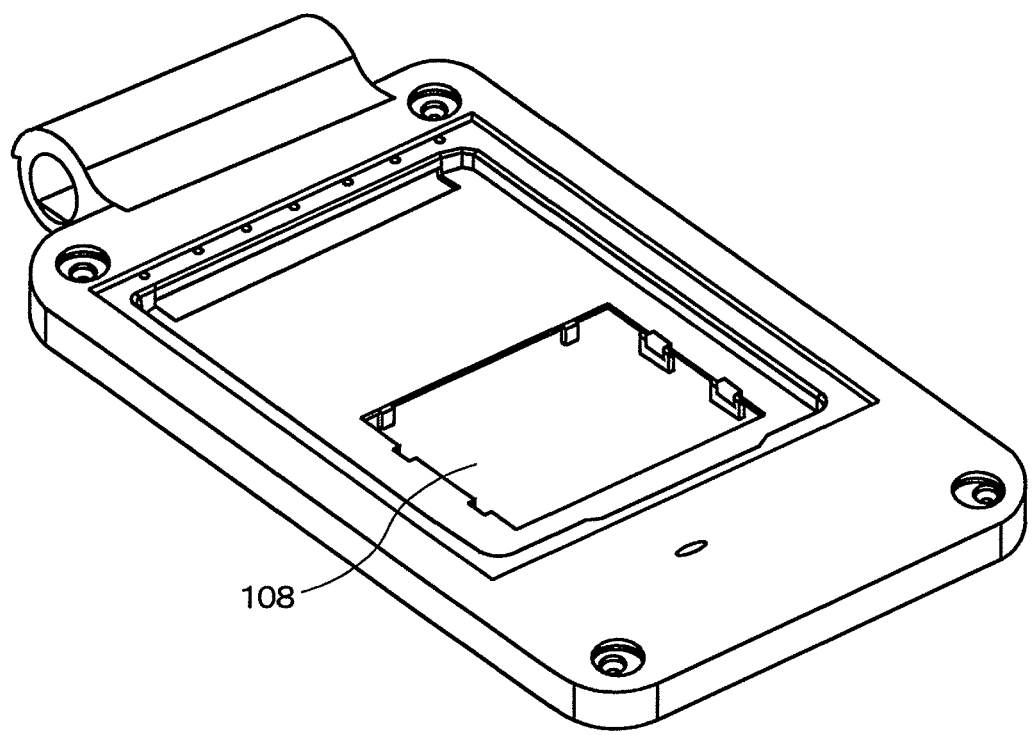
FIG. 10 is a perspective view showing the casing structure of FIG. 7 having a punched opening in the fitting member of the rear surface display unit.

FIG. 10 is similarly a device having a punched aperture 108 in the fitting member of the rear surface display unit. The thickness of the thin metal plate portion can thereby be reduced, and the thickness of the device can also be further reduced. The backlight can be shared when the main display unit and the rear surface display unit are both backlit liquid crystals.

Figure 11:
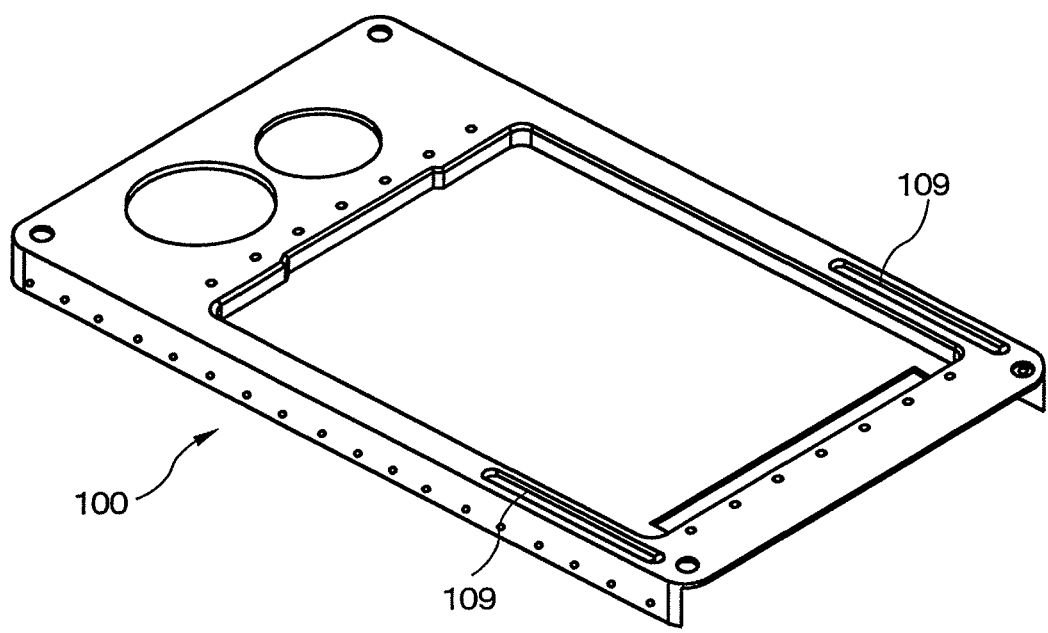
FIG. 11 is a perspective view showing the casing structure of a portable device according to a third embodiment of the present invention.

FIG. 11 is a perspective view showing the metal structure 100 of the portable device according to a third embodiment of the present invention. The overall length would be further increased in a folding portable phone, and the flexural rigidity in the lengthwise direction becomes important, but in the present invention, a drawn member 109 for strengthening the flexural rigidity of the vicinity of the hinge is provided according to the present embodiment to the hinge part where the strongest loads are applied. This drawn member 109 is drawn so as to provide a cross section that is U shaped. The rigidity in the vicinity of the hinge, which sustains the load when the device falls or at other times, can thereby be increased, and a balance in the overall rigidity can be achieved.

Figure 12:
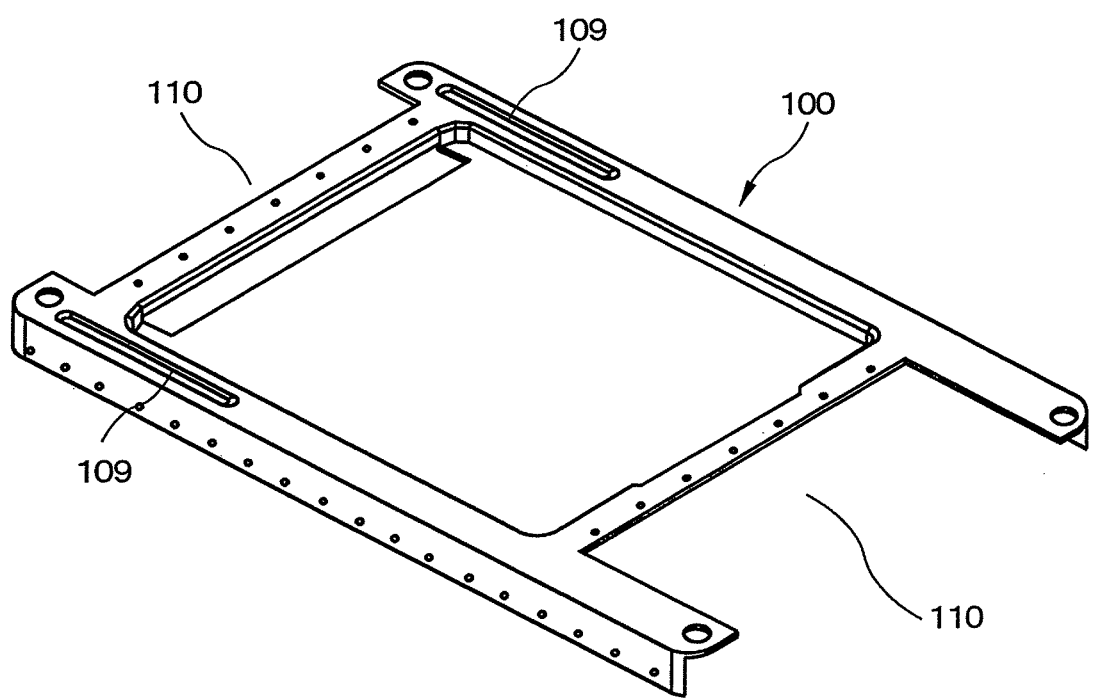
FIG. 12 is a perspective view showing the casing structure of a portable device according to a fourth embodiment of the present invention.

FIG. 12 is a perspective view showing the metal structure 100 of the portable device according to a fourth embodiment of the present invention. The metal structure 100 of this embodiment is one in which unnecessary portions of the metal structure 100 of the portable device of the third embodiment shown in FIG. 11 are cut away to provide a cutaway section 110, as shown in the drawing. In this manner, the metal structure 100 can still demonstrate its effect even without being present over the entire surface of the resin casing 200. The mounting area for the internal components of the device can be increased by providing the cutaway sections 110.

Figure 13:
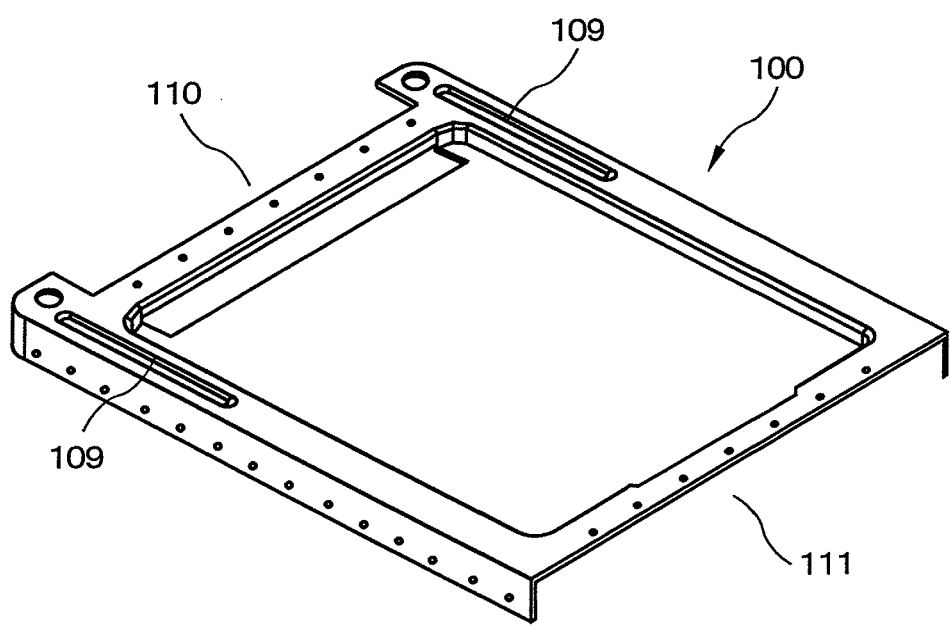
FIG. 13 is a perspective view showing the casing structure of a portable device according to a fifth embodiment of the present invention.
Figure 14:
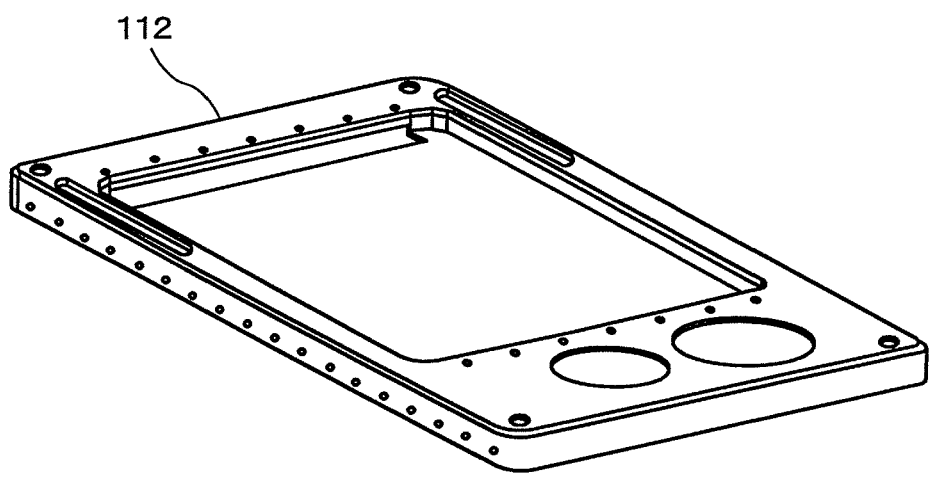
FIG. 14 is a perspective view showing the casing structure of a portable device according to sixth embodiment of the present invention.

FIG. 13 is a perspective view showing the metal structure 100 of a portable device according to a fifth embodiment of the present invention. In present embodiment, the end portion of the metal structure 100 is severed so as to reduce the entire length of the metal structure, and a cut section 111 is provided. It is possible to secure a region without metal and a necessary antenna region in portable phones and other communication devices when the cut section 111 shown in FIG. 13 is provided. In this case, the thin metal plate is entirely removed in some areas, and the rigidity of the removed portions is therefore reduced. However, sufficient strength can be assured by maintaining the rigidity of the overall casing structure, including the rigidity of the rear cover, because the display unit portion is protected.

On the other hand, strength can be increased by disposing the rib 112 in three or four side wall surfaces and making a contiguous surface. Also, this rib structure is effective when the metal structure is made even thinner, or when the drawn member as shown in the third embodiment cannot be provided.

In the present invention, a frame-shaped metal casing that is formed integrally with the metal structure by injection molding can be provided in place of the resin casing of the embodiments. In this case, the metal casing is molded by metal injection molding, which includes thixotropic molding or die-casting, and the coefficient of thermal expansion of the metal material to be molded is greater than the coefficient of thermal expansion of the metal structure.

In the embodiments structured in this manner, the display unit of the portable device can be protected, the rigidity characteristics of the casing can be enhanced, and a smaller and thinner profile can be realized. In these embodiments as well, the metal structure has a rib structure along the bottomed concave-shaped part. Also, the metal structure is formed by drawing a thin metal plate, and the side wall surfaces of the bottomed concave-shaped part are contiguous. Additionally, the metal structure is formed by sintering or precision casting, including injection molding. Also, the metal casing is exposed on the exterior surface. The display unit is a backlit liquid crystal, the flat bottom surface of the bottomed concave-shaped part of the metal structure that holds the display unit of the metal structure is composed of a mirror finish section, and the mirror finish section doubles as a reflecting plate of the liquid crystal backlight. Also, the rib structure portion of the metal structure has a drawn part that is drawn into a cross-sectional concave shape.

INDUSTRIAL APPLICABILITY

The present invention can be used as the strap holder of a portable phone, a digital camera, a PDA, or another portable device.

The invention claimed is:

1. A casing structure for a portable device having a display unit, comprising:
    a metal structure composed of a molded metal plate article that has contiguous side walls and a bottomed concave-shaped portion;
    a display unit provided in said bottomed concave-shaped portion; and
    a frame-shaped metal casing provided on and integral with a surface of the metal structure, said frame-shaped metal casing provided outside of said side walls as viewed from said display unit, wherein
    the metal casing is directly contacted to the metal structure in an inseparably integrated fashion.

2. The casing structure according to claim 1, wherein said metal structure further includes a rib structure extending therefrom.

3. The casing structure according to claim 1, wherein said metal structure is formed by drawing a thin metal plate, and the side wall surfaces of the bottomed concave-shaped portion are contiguous.

4. The casing structure according to claim 1, wherein said metal structure is one of a sintered and a precision casted structure.

5. The casing structure according to claim 1, wherein the metal casing is a metal injection molded casing provided on and integral with a surface of the metal structure.

6. The casing structure according to claim 1, wherein:
    said display unit is a backlit liquid crystal display unit;
    a flat bottom surface of the bottomed concave-shaped portion includes a mirror finish section; and
    the mirror finish section doubles as a reflecting plate of the backlit liquid crystal unit.

7. The casing structure according to claim 1, wherein:
    a rib structure portion of said metal structure has a drawn portion with a cross-sectional concave shape.

8. The casing structure according to claim 1, wherein:
    said metal structure has ribs around said side walls; and
    said metal casing is provided on or along at least a surface of said ribs.

9. A portable device, comprising:
    a metal structure comprising a top plate having opposed upper and lower surfaces, a recessed area formed in the top plate, the recessed area being defined by a bottom plate and recess walls extending downwardly from the top plate to the bottom plate, the metal structure further comprising at least two opposing outer walls extending downwardly from the top plate at locations outside of the recessed area, each of the outer walls have respective opposed inner and outer surfaces; and
    a casing formed integrally with and around the metal structure and covering at least portions of the upper and lower surfaces of the top plate and at least portions of the inner and outer surfaces of the opposing outer walls so as to hold the metal structure therebetween, the casing being formed of a material having a coefficient of thermal expansion that is greater than a coefficient of thermal expansion of the metal structure.

10. The portable device of claim 9, wherein at least one coupling hole is formed in at least one of the outer walls and the casing extends into at least one of the coupling holes so as to cause the casing to be integral with the metal structure.

11. The portable device according to claim 10, wherein at least one of the coupling holes is sized such that a material of the casing enters into the at least one aperture of the coupling holes during a molding process.

12. The portable device according to claim 9, further comprising a display unit located in the recessed area.

13. The portable device according to claim 12, wherein an aperture is provided through at least one of the bottom plate and at least one of the recess walls.

14. The portable device according to claim 13, wherein the display unit and a wiring board are connected by a wire that passes through the aperture.

15. The portable device according to claim 12, wherein:
the display unit is a backlit liquid crystal unit; and
the bottom plate of the metal structure includes a mirror finish section.

16. The portable device according to claim 15, wherein the mirror finish section acts as a reflecting plate of the backlit liquid crystal unit.

17. The portable device according to claim 12, wherein the bottom plate includes notches.

18. The portable device according to claim 17, wherein holding pawls that hold a rear surface display unit are provided in the notches.

19. The device according to claim 12, wherein the bottom plate includes an aperture configured to hold a rear surface display unit.

20. The portable device according to claim 19, wherein:
the display unit and the rear surface display unit are backlit liquid crystal units; and
a backlight is shared through the aperture by the display unit and the rear surface display unit.

21. The portable device according to claim 9, wherein a drawn portion is provided in a vicinity of a hinge area on the first bottom plate.

22. The portable device according to claim 9, wherein there are at least two contiguous outer walls.

23. The portable device according to claim 9, wherein the metal structure is a drawn metal plate.

24. The portable device according to claim 9, wherein the metal structure is one of a sintered and precision casted metal structure.

25. A casing structure for a portable device having a display unit, comprising:
a metal structure composed of a molded metal plate article that has side walls and a bottomed concave-shaped portion;
a display unit provided in said bottomed concave-shaped portion; and
a frame-shaped metal casing provided on and integral with a surface of the metal structure, said frame-shaped metal casing provided outside of said side walls as viewed from said display unit, wherein
the bottomed concave-shaped portion has a bottom plate and side plates provided around the bottom plate,
the metal casing has first portions provided on or along both sides of at least two of the side plates that are opposing each other so as to hold the metal structure therebetween, and
the first portions are formed to extend to an edge surface of a side wall of the metal structure.

26. The casing structure according to claim 25, wherein said metal structure further includes a rib structure extending therefrom.

27. The casing structure according to claim 25, wherein said metal structure is formed by drawing a thin metal plate, and the side wall surfaces of the bottomed concave-shaped portion are contiguous.

28. The casing structure according to claim 25, wherein said metal structure is one of a sintered and a precision casted structure.

29. The casing structure according to claim 25, wherein:
said display unit is a backlit liquid crystal display unit;
a flat bottom surface of the bottomed concave-shaped portion includes a mirror finish section; and
the mirror finish section doubles as a reflecting plate of the backlit liquid crystal unit.

30. The casing structure according to claim 25, wherein:
a rib structure portion of said metal structure has a drawn portion with a cross-sectional concave shape.

31. The casing structure according to claim 25, wherein:
said metal structure has ribs around said side walls; and
said metal casing is provided on or along at least a surface of said ribs.

32. A portable device, comprising:
a metal structure comprising a top plate having a recessed area formed therein, the recessed area being defined by a bottom plate and recess walls extending downwardly from the top plate to the bottom plate, the metal structure further comprising at least one outer wall extending downwardly from the top plate at locations outside of the recessed area, at least one of the outer walls having at least one coupling hole formed therein; and
a casing formed around the metal structure and covering at least portions of the top plate and at least portions of the at least one outer wall and extending into at least one of the coupling holes so as to cause the easing to be integral with the metal structure, the casing being formed of a material having a coefficient of thermal expansion that is greater than a coefficient of thermal expansion of the metal structure.

33. The portable device according to claim 32, wherein the casing has an opening corresponding to the recessed area.

34. The portable device according to claim 32, wherein each of the at least one of the coupling holes is sized such that a material of the casing enters into the at least one of the coupling holes during a molding process.

35. The portable device according to claim 32, further comprising a display unit located in the recessed area.

36. The portable device according to claim 35, wherein an aperture is provided through at least one of the bottom plate and the recess walls.

37. The portable device according to claim 36, wherein the display unit and a wiring board are connected by a wire that passes through the aperture.

38. The portable device according to claim 35, wherein:
the display unit is a backlit liquid crystal unit; and
the bottom plate includes a mirror finish section.

39. The portable device according to claim 38, wherein the mirror finish section acts as a reflecting plate for the backlit liquid crystal unit.

40. The portable device according to claim 35, wherein the bottom plate includes notches.

41. The portable device according to claim 40, wherein holding pawls that hold a rear surface display unit are provided in the notches.

42. The device according to claim 35, wherein the bottom plate includes an aperture configured to hold a rear surface display unit.

43. The portable device according to claim 42, wherein:
the display unit and the rear surface display unit are backlit liquid crystal units; and
a backlight is shared through the aperture by the display unit and the rear surface display unit.

44. The portable device according to claim 32, wherein a drawn portion is provided in a vicinity of a hinge area on the first bottom plate.

45. The portable device according to claim 32, wherein there are at least two contiguous outer side walls.

46. The portable device according to claim 32, wherein the metal structure is a drawn metal plate.

47. The portable device according to claim 32, wherein the metal structure is one of a sintered and precision casted metal structure.

48. The portable device of claim 32, wherein each of the at least one outer wall is formed along an outer periphery of the top plate.

* * * * *